(12) United States Patent
Chiozzi

(10) Patent No.: US 7,710,329 B2
(45) Date of Patent: May 4, 2010

(54) SYSTEM INCLUDING AN INTER-CHIP COMMUNICATION SYSTEM

(75) Inventor: Giorgio Chiozzi, Padua (IT)

(73) Assignee: Infineon Technologies Austria AG, Villach (AT)

(*) Notice: Subject to any disclaimer, the term of this patent is extended or adjusted under 35 U.S.C. 154(b) by 206 days.

(21) Appl. No.: 11/944,720

(22) Filed: Nov. 26, 2007

(65) Prior Publication Data

US 2009/0134489 A1 May 28, 2009

(51) Int. Cl.
*H01Q 1/38* (2006.01)
*H01Q 21/00* (2006.01)

(52) U.S. Cl. .................... 343/700 MS; 343/853

(58) Field of Classification Search .......... 343/700 MS, 343/850, 853, 787, 893; 257/686, 797
See application file for complete search history.

(56) References Cited

U.S. PATENT DOCUMENTS

| 2007/0266557 A1* | 11/2007 | Drost et al. ............ 29/834 |
| 2008/0018000 A1* | 1/2008 | Krishnamoorthy et al. .. 257/797 |
| 2009/0067851 A1* | 3/2009 | Krishnamoorthy et al. .. 398/164 |
| 2009/0085183 A1* | 4/2009 | Mitchell et al. ............ 257/686 |

* cited by examiner

*Primary Examiner*—Hoang V Nguyen
(74) *Attorney, Agent, or Firm*—Dicke, Billig & Czaja, PLLC

(57) ABSTRACT

A system including an inter-chip communication system is disclosed. One embodiment includes a base chip including a base chip transceiver network. At least one chip is stacked on the base chip, the at least one stacked chip including a substrate, a cavity formed in the substrate, a first surface, and a stacked chip transceiver network disposed on the first surface adjacent to the cavity.

21 Claims, 3 Drawing Sheets

US 7,710,329 B2

SYSTEM INCLUDING AN INTER-CHIP COMMUNICATION SYSTEM

BACKGROUND

One or more embodiments relate to a system, and inductive coupling between functions of systems. One or more embodiments relate to inductive coupling for communication between functions of an LSI system.

With the number of functions that are being integrated on chips increasing at approximately 50% per year, processing speed of each function increasing about 15% per year, and overall integrated circuit (IC) data processing power increasing around 70% per year, pin bandwidth must increase approximately 45% per year in order to benefit from these gains. However, there is currently a gap between available pin bandwidth increases and required pin bandwidth increases.

One method of addressing this gap is the use of "system on chip" technology. However, although "system on chip" technology may reduce the gap, high development costs prohibit an economically viable implementation. Another method of reducing the gap between required versus available intra-chip communication speed is "system in package" technology. Possible "system in package" intra-chip data connection technologies include micro bumps, vias through silicon (VTS), wireless capacitive coupling and wireless inductive coupling. However, the use of micro bumps and capacitive coupling limit the number of stacked chips and the configuration of the stacked chips. For example, only two chips can be stacked, and the chips must be placed face to face. Furthermore, the bottom chip, as required by many applications, cannot typically be placed face to face with a stacked chip. VTS technology requires expensive investment in manufacturing, and thus is not a practical solution.

Furthermore, although inductive coupling has been demonstrated, cross talk and signal dispersion in the silicon bulk limits the number of stacked chips, the maximum thickness of the chips, and the density of the transceiver channels. Another factor that limits the practical application of inductive coupling is the transmission power required to offset signal attenuation due to signal losses and dispersion in the silicon bulk.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

A system is provided for inductively-coupling communication between functions of a large-scale integration (LSI) system. In one embodiment of the invention, a communication system includes a base chip and at least one chip stacked on the base chip. The base chip and the stacked chips have transceiver networks configured for inter-chip communication. The transceiver networks are disposed on the electronically active surfaces of the chips. A stacked chip has a substrate and a cavity formed in the substrate. The transceiver network of the stacked chip is disposed on the active surface adjacent the cavity. The base chip transceiver network, the cavities, and the transceiver networks of the stacked chips are disposed along a longitudinal axis z, where the longitudinal axis z is defined to be perpendicular to any of the active surfaces of the chips.

In another embodiment, each transceiver network includes a plurality of antennas. Furthermore, the antennas of each transceiver network may be configured in a regular pattern, such as an antenna array. In one embodiment, an array of antennas is an array of metal inductors.

In another embodiment, a transceiver network further includes an array of magnetic conducting elements. In yet another embodiment, a magnetic conducing element of the array of magnetic conducting elements is positioned at or near a center of a metal inductor of the array of metal inductors.

Figure 1:
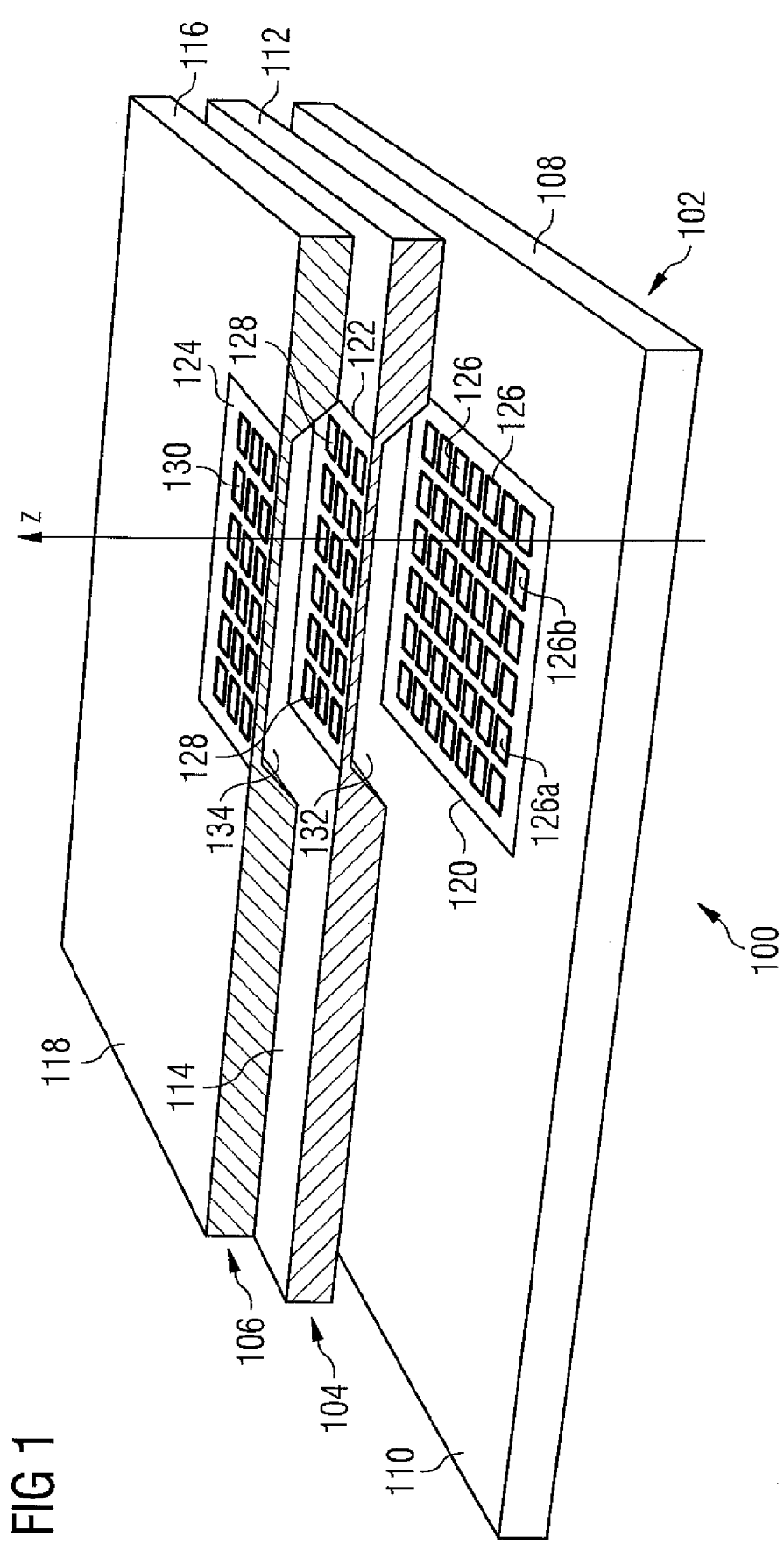
FIG. 1 illustrates an inductively-coupled LSI system, according to one embodiment.

FIG. 1 illustrates an inductively-coupled LSI system 100, according to one embodiment. The inductively-coupled LSI system 100 includes a base chip 102, a first stacked chip 104 and a second stacked chip 106. The base chip 102 includes a base chip substrate 108 and a base chip active surface 110. The first stacked chip 104 includes a first stacked chip substrate 112 and a first stacked chip active surface 114. The second stacked chip 106 includes a second stacked chip substrate 116 and a second stacked chip active surface 118. The active surface refers to the surface of a chip that is adjacent the electronic circuitry integrated onto the chip. For future directional reference, FIG. 1 illustrates a longitudinal axis z that is perpendicular to the plane of the chips (i.e., perpendicular to the active surfaces 110, 114 and 118).

Each chip has at least one transceiver network that is operable with other analog and digital functions integrated on each chip. For example, the base chip 102 has a first transceiver network 120, the first stacked chip 104 has a second transceiver network 122, and the second stacked chip 106 has a third transceiver network 124. The scope of the invention covers any number of stacked chips. In one embodiment, base chip 102 is a logic chip, including logic circuitry for accessing and/or controlling memory arrays, including but not limited to RAM, ROM, FLASH and EPROM, for example. The logic circuitry may also be configured to access and control other logic and analog chips that may be stacked onto the base chip 102. The base chip 102 may include any combination of digital circuitry, analog circuitry, bus lines, memory, microprocessors, power sources, input/output interfaces, and other LSI circuitry that is well known to one of skill in the art.

In one embodiment, one or more of the stacked chips (i.e., the first stacked chip 104 and the second stacked chip 106) include memory arrays. As known to one of skill in the art, the chips 104 and 106 may also include data read and write lines, power and biasing lines, and associated circuitry to address specific memory cells. In one embodiment, the inductively-coupled LSI system 100 is a solid state hard drive, where the base chip 102 is a hard disk controller chip and the plurality of stacked chips (i.e., chips 104 and 106) are memory chips.

In one embodiment, each transceiver network includes a plurality of antennas. As illustrated, first transceiver network 120 includes first antennas 126, second transceiver network 122 includes second antennas 128, and third transceiver network 124 includes third antennas 130. Each antenna of antennas 126, 128 and 130 is electrically coupled (wired or unwired) to transceiver circuitry residing on the same chip. Transceiver circuitry is well know to one of skill in the art, and will not be discussed further. In one embodiment, the first antennas 126 are configured as a first array of antennas, the second antennas 128 are configured as a second array of antennas, and the third antennas 130 are configured as a third array of antennas.

In another embodiment, the antennas 126, 128 and 130 are metal inductors. Exemplary embodiments of the metal inductors will be discussed further below in conjunction with FIGS. 2A and 2B. In one embodiment, the first antennas 126, the second antennas 128, and the third antennas 130 are positioned relative to one another to optimize inductive interchip communication of information. The information may include data or command information and may be communicated as a digital, analog, or pulsed signal, or by other types of carrier waves known to those of skill in the art. Information may be inductively communicated from any one plurality of antennas to any other plurality of antennas. For example, the base chip 102 and first stacked chip 104 may inductively communicate information via the first antennas 126 and the second antennas 128. Additionally, the base chip 102 and second stacked chip 106 may inductively communicate information via the first antennas 126 and the third antennas 130, or via the first, second and third antennas, 126, 128 and 130, respectively.

In order to facilitate inductive communication of information between the chips, the stacked chips have cavities formed in the substrate adjacent the plurality of antennas. For example, as illustrated in FIG. 1, the first stacked chip 104 has a first cavity 132 formed in the first stacked chip substrate 112, and the second stacked chip 106 has a second cavity 134 formed in the second stacked chip substrate 116. As illustrated, the first cavity 132 is formed in the first stacked chip substrate 112 adjacent the second antennas 128, and the second cavity 134 is formed in the second stacked chip substrate 116 adjacent the third antennas 130.

In one embodiment, the first antennas 126, the first cavity 132, the second antennas 128, the second cavity 134, and the third antennas 130 are disposed adjacent each other along the longitudinal axis z. The placement of the cavities 132 and 134 in line with the first, second and third array of antennas reduces signal loss and dispersion by reducing signal propagation distance in the silicon substrate. Reduction of signal loss and signal dispersion improves the inductive coupling between antenna arrays, thereby increasing bandwidth and/or decreasing chip power consumption.

Figure 2A:
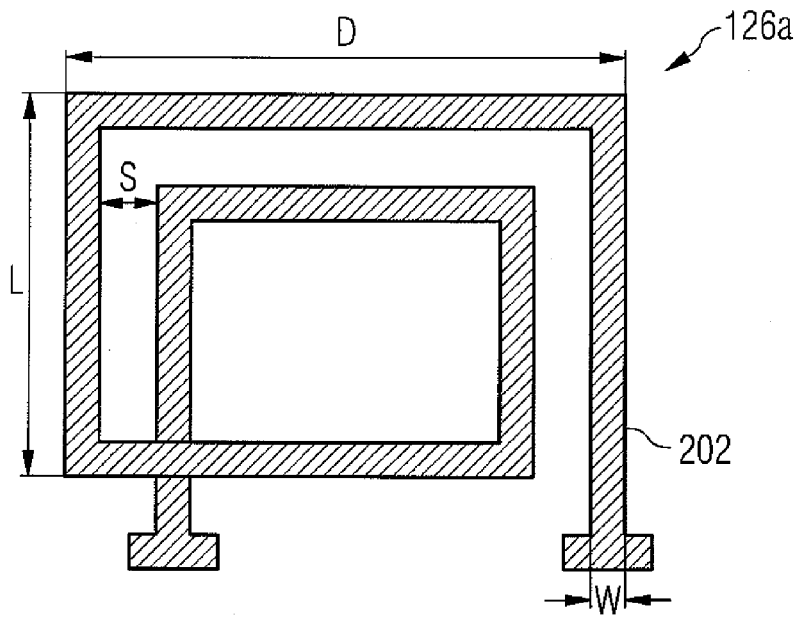
FIG. 2A illustrates an antenna that is integrated on a chip as illustrated in FIG. 1, according to one embodiment.

FIG. 2A illustrates an antenna 126a that is integrated on base chip 102 as illustrated in FIG. 1, according to an embodiment. The antenna 126a is configured as a metal inductor, including a metal strip 202 of width w, n windings of the metal strip 202, a length L, a width D, and a spacing s between the windings. In the example embodiment as illustrated, the metal inductor has two windings (i.e., n=2). In one embodiment, the n windings of the metal strip 202 are formed in a plane layer of the base chip 102. A plane layer in a chip is any layer having a normal vector (i.e., a vector perpendicular to the plane layer) that is parallel to the longitudinal axis z. The metal strip may be aluminum, or composed of other metals or metallic alloys known to one of skill in the art. The scope of the invention covers other embodiments of metal inductors of any suitable spatial configuration. As known by one of skill in the art, the parameters L, D, w, n and s of the metal inductor 126a may be chosen to optimize any of the following operating parameters, individually or in a weighted combination: chip power consumption, signal directionality, signal strength and signal form.

Figure 2B:
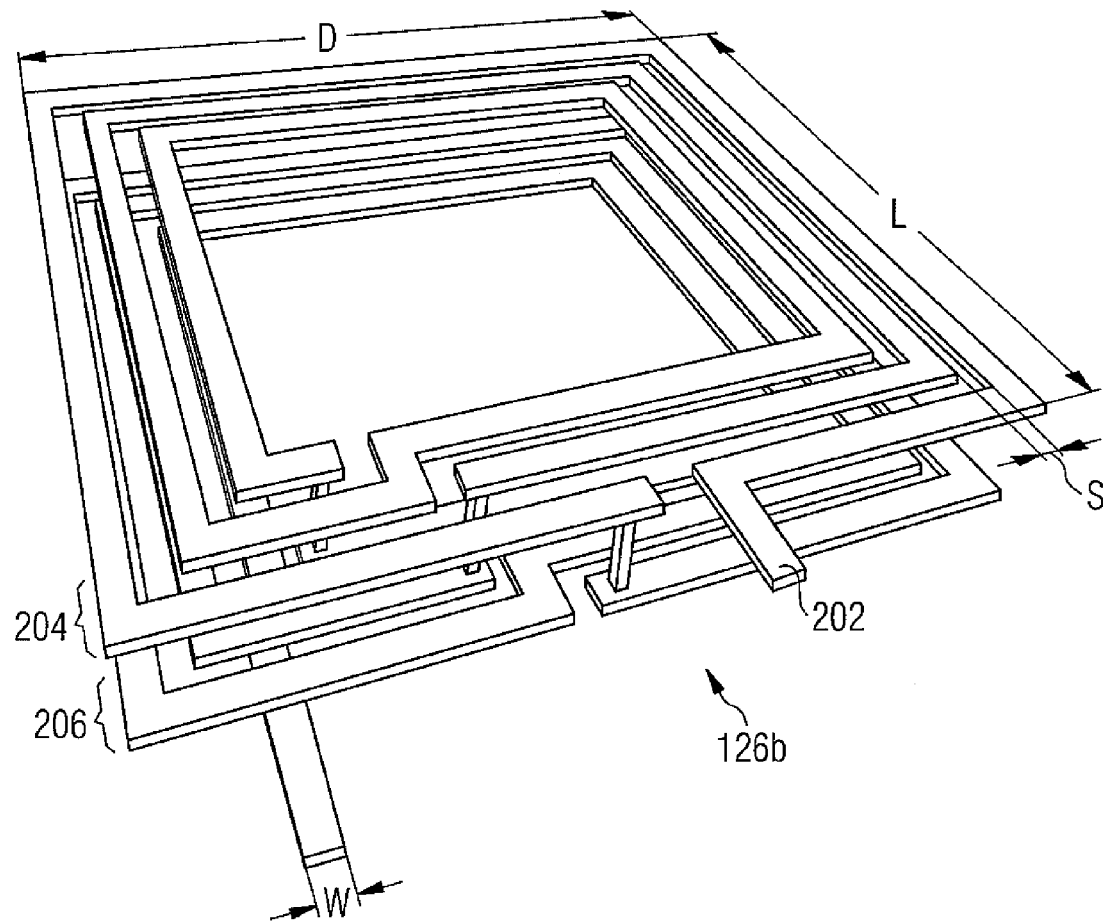
FIG. 2B illustrates an antenna that is integrated on a chip as illustrated in FIG. 1, according to another embodiment.

FIG. 2B illustrates an antenna 126b that is integrated on base chip 102 as illustrated in FIG. 1, according to an embodiment. The antenna 126b is configured as a metal inductor. The reference numbers used in FIG. 2A refer to the same elements in FIG. 2B. As illustrated, the antenna 126b includes a metal strip 202 of width w with n windings formed on a first layer 204 of the chip 102 and m windings formed on a second layer 206 of the chip 102. In the embodiment as illustrated, n=3 and m=3. This "stacking" of the windings increases the inductive coupling efficiency while optimizing the on-chip area required for a metal inductor element with m+n windings.

Figure 3:
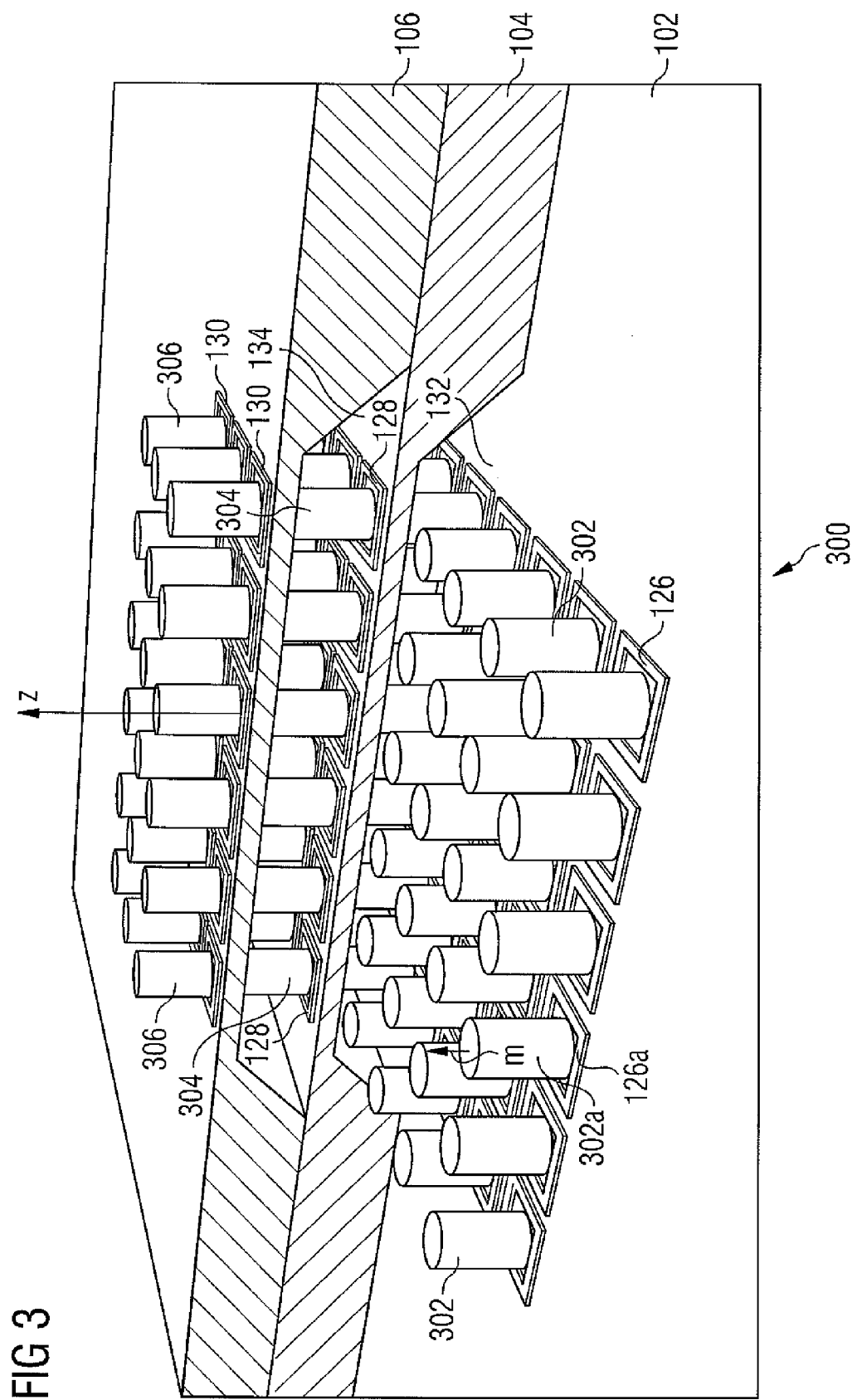
FIG. 3 illustrates an inductively-coupled LSI system, according to another embodiment.

FIG. 3 illustrates an inductively-coupled LSI system 300, according to another embodiment. The inductively-coupled system 300 includes first magnetic conducting elements 302 integrated on base chip 102, second magnetic conducting elements 304 integrated on first stacked chip 104, and third magnetic conducting elements 306 integrated on second stacked chip 106. Except for the first, second and third magnetic conducting elements 302, 304 and 306, the inductively-coupled system 300 is identical to the inductively-coupled system 100 of FIG. 1. In one embodiment, the first magnetic conducting elements 302 are configured as a first array of magnetic conducting elements, the second magnetic conducting elements 304 are configured as a second array of magnetic conducting elements, and the third magnetic conducting elements 306 are configured as a third array of magnetic conducting elements.

As illustrated, the magnetic conducting elements and the antennas of a chip are integrated in close proximity to one another. For example, the first magnetic conducting elements 302 are integrated in close proximity to the first antennas 126. In one embodiment, each magnetic conducting element is positioned at or near a center of each antenna. As an example embodiment, a first magnetic conducting element 302a is at or near a center of the first antenna 126a. Additionally, each magnetic conducting element is configured such that a longitudinal axis m of the magnetic conducting element is oriented parallel to the longitudinal axis z. As illustrated, the longitudinal axis m of the first magnetic conducting element 302a is oriented parallel to the longitudinal axis z.

In operation, the magnetic conducting elements channel and guide the inductively-generated magnetic field between the transceiver networks. The magnetic conducting elements (302, 304 and 306) in combination with the cavities (132 and 134) improve inductive coupling between the antennas (126, 128 and 130) and reduce cross-talk and dispersion in the silicon bulk (i.e., the silicon substrate). Furthermore, the magnetic conducting elements in combination with the cavities may allow for a greater number of stacked chips, a greater density of transceiver channels, increased chip thickness, and decreased transmitter power of the transceiver networks.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A system including an inter-chip communication system, comprising:
    a base chip comprising a base chip transceiver network; and
    at least one chip stacked on the base chip, the at least one stacked chip comprising:
    a substrate;
    a cavity formed in the substrate;
    a first surface; and
    a stacked chip transceiver network disposed on the first surface adjacent to the cavity, wherein the base chip transceiver network, the cavity, and the stacked chip transceiver network are disposed along a longitudinal axis z, the longitudinal axis z perpendicular to the first surface of the at least one stacked chip.

2. The system of claim 1, wherein the base chip transceiver network comprises a first plurality of antennas and the stacked chip transceiver network comprises a second plurality of antennas.

3. The system of claim 2, comprising wherein the first plurality of antennas is a first array of antennas and the second plurality of antennas is a second array of antennas.

4. The system of claim 3, comprising wherein the first array of antennas is a first array of metal inductors and the second array of antennas is a second array of metal inductors.

5. The system of claim 4, comprising wherein the first and second array of metal inductors are configured to facilitate inductive inter-chip communication.

6. The system of claim 4, comprising wherein at least one metal inductor of the first and second array of metal inductors comprises multiple windings.

7. The system of claim 4, comprising wherein at least one metal inductor of the first and second array of metal inductors comprises windings on at least two layers of at least one of the base chip and the at least one stacked chip.

8. The system of claim 3, wherein the base chip transceiver network further comprises a first array of magnetic conducting elements.

9. The system of claim 8, comprising wherein the first array of antennas is a first array of metal inductors, a magnetic conducing element of the first array of magnetic conducting elements positioned at a center of a metal inductor of the first array of metal inductors.

10. The system of claim 8, comprising wherein the stacked chip transceiver network further comprises a second array of magnetic conducting elements.

11. The system of claim 10, comprising wherein the second array of antennas is a second array of metal inductors, a magnetic conducing element of the second array of magnetic conducting elements positioned at a center of a metal inductor of the second array of metal inductors.

12. The system of claim 10, comprising wherein a longitudinal axis m of a magnetic conducting element of the first and second arrays of magnetic conducting elements is parallel to the longitudinal axis z.

13. The system of claim 1, comprising wherein the substrate is silicon.

14. The system of claim 1, comprising wherein the base chip is a hard disk controller chip.

15. The system of claim 1, comprising wherein the at least one stacked chip is a memory chip.

16. An integrated circuit including an inter-chip communication system, comprising:
    a base chip comprising a base chip transceiver network;
    at least one chip stacked on the base chip; and
    an inductive inter-chip communication system between the base chip and the at least one stacked chip, including a first array of inductors associated with the base chip and a second array of inductors associated with the at least one stacked chip; and
    a first magnetic conducting element positioned at a center of an inductor of the first array of inductors.

17. The integrated circuit of claim 16, comprising:
    a second magnetic conducting element positioned at a center of an inductor of the second array of inductors.

18. An integrated including an inter-chip communication system, comprising:
    a base chip comprising a base chip transceiver network;
    at least one chip stacked on the base chip; and
    an inductive inter-chip communication system between the base chip at least one stacked chip, including a first array of inductors associated with the base chip and a second array of inductors associated with the at least one stacked chip; and
    the inductive inter-chip communication system including a stacked chip transceiver network disposed on a first surface adjacent to a cavity of the stacked chip, wherein a base chip transceiver network, the cavity, and the stacked chip transceiver network are disposed along a longitudinal axis z, the longitudinal axis z perpendicular to the first surface of the at least one stacked chip.

19. A large scale integration system including an inter-chip communication system, comprising:
    a base chip comprising a controller including a base chip transceiver network; and
    at least one memory chip stacked on the base chip comprising, a substrate, a cavity formed in the substrate, a first surface, and a stacked chip transceiver network disposed on the first surface adjacent to the cavity, wherein the base chip transceiver network, the cavity, and the stacked chip transceiver network are disposed along a longitudinal axis z, the longitudinal axis z perpendicular to the first surface of the at least one stacked chip.

20. The system of claim 19, wherein the base chip transceiver network comprises a first plurality of antennas comprising a first array of metal inductors and the stacked chip transceiver network comprises a second plurality of antennas comprising a second array of metal inductors, wherein the first and second array of metal inductors are configured as an inductive inter-chip communication system.

21. A system comprising:
    a first chip with a first transceiver network; and
    a second chip with a second transceiver network comprising an array of inductors, and an array of magnetic conducting elements, wherein each magnetic conducting element is positioned at a center of an inductor of the array of inductors.

* * * * *